United States Patent
Ben Hassen et al.

(10) Patent No.: US 10,935,589 B2
(45) Date of Patent: Mar. 2, 2021

(54) METHOD FOR DETECTING SOFT FAULTS IN A CABLE BY DATA FUSION

(71) Applicant: COMMISSARIAT A L'ENERGIE ATOMIQUE ET AUX ENERGIES ALTERNATIVES, Paris (FR)

(72) Inventors: Wafa Ben Hassen, Paris (FR); Julien Mottin, Grenoble (FR); Antoine Dupret, Orsay (FR); Miguel Gallego Roman, Paris (FR); Suzanne Lesecq, Froges (FR); Diego Puschini Pascual, Grenoble (FR); Nicolas Ravot, Chelles (FR); Armando Zanchetta, Bons-Enchablais (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 150 days.

(21) Appl. No.: 16/092,129

(22) PCT Filed: Mar. 28, 2017

(86) PCT No.: PCT/EP2017/057296
§ 371 (c)(1),
(2) Date: Oct. 8, 2018

(87) PCT Pub. No.: WO2017/147700
PCT Pub. Date: Oct. 12, 2017

(65) Prior Publication Data
US 2019/0107573 A1    Apr. 11, 2019

(30) Foreign Application Priority Data
Apr. 8, 2016   (FR) ...................... 1653095

(51) Int. Cl.
*G01R 31/08* (2020.01)
*G01R 31/11* (2006.01)
*G01R 1/00* (2006.01)

(52) U.S. Cl.
CPC ............ *G01R 31/088* (2013.01); *G01R 31/11* (2013.01)

(58) Field of Classification Search
CPC ........ G01R 1/00; G01K 1/00; G01K 2201/00; G01M 1/00; G06F 1/00; H04B 1/00; H04B 2201/00
See application file for complete search history.

(56) References Cited

U.S. PATENT DOCUMENTS 8,359,177 B2 * 1/2013 Lelong ..................... H04B 3/46
                                                    702/66
8,918,295 B2 * 12/2014 Lelong ................... G01R 31/11
                                                    702/58
(Continued)

FOREIGN PATENT DOCUMENTS

FR      1554632 A    1/1969
GB    2 496 121 A    5/2013
(Continued)

OTHER PUBLICATIONS

Shin et al. "Joint Time-Frequency Domain Reflectometry for Diagnostics of Coaxial Cables", In 8th Joint NASA/FAA/DoD Conference on Aging Aircraft, 2005.
(Continued)

*Primary Examiner* — Jermele M Hollington
*Assistant Examiner* — Temilade S Rhodes-Vivour
(74) *Attorney, Agent, or Firm* — BakerHostetler

(57) ABSTRACT

A method for detecting soft faults in a transmission line includes the following steps: acquiring a measurement, called time-domain reflectogram, of a signal characteristic
(Continued)

of the reflection of a reference signal previously injected into the line, determining the difference between the time-domain reflectogram and a time-domain reflectogram measured previously for the same line or an identical line of similar characteristics, in order to obtain a corrected time-domain reflectogram, applying a plurality of independent transformations to the corrected time-domain reflectogram in order to obtain a plurality of independent transformed reflectograms, converting the transformed reflectograms into a plurality of mutually independent probabilities of occurrence of a fault, applying a data merging method to the probabilities of occurrence of a fault to deduce therefrom a unified value of the probability of occurrence of a fault.

11 Claims, 5 Drawing Sheets

(56) References Cited

U.S. PATENT DOCUMENTS

| | | |
|---|---|---|
| 2005/0057880 A1 | 3/2005 | Bailey et al. |
| 2013/0243167 A1* | 9/2013 | Drooghaag ............ H04M 3/306 379/27.03 |
| 2014/0029932 A1* | 1/2014 | Randel ................. H04B 10/071 398/13 |
| 2014/0222356 A1* | 8/2014 | Incarbone .............. G01R 31/11 702/59 |
| 2014/0347066 A1* | 11/2014 | Zach .................. G01R 31/1272 324/537 |

FOREIGN PATENT DOCUMENTS

| | | |
|---|---|---|
| WO | 2013/057131 A1 | 4/2013 |
| WO | 2014/198526 A1 | 12/2014 |
| WO | 2016/050547 A | 4/2016 |
| WO | 2017/148753 A1 | 9/2017 |

OTHER PUBLICATIONS

Lola El, "Méthodes d'amélioration pour le diagnostic de câble par réflectométrie", [Enhancement methods for reflectometry-based cable diagnostics], Université Blaise Pascal—Clermont-Ferrand II, 2013.
Moravec, "Sensor fusion in certainty grids for mobile robots", in AI Mag., vol. 9, Jul. 1988.
Berger, "Statistical decision theory and Bayesian analysis", 2nd edition, Springer, 1985.

* cited by examiner

METHOD FOR DETECTING SOFT FAULTS IN A CABLE BY DATA FUSION

CROSS-REFERENCE TO RELATED APPLICATIONS

This application is a National Stage of International patent application PCT/EP2017/057296, filed on Mar. 28, 2017, which claims priority to foreign French patent application No. FR 1653095, filed on Apr. 8, 2016, the disclosures of which are incorporated by reference in their entirety.

FIELD OF THE INVENTION

The invention relates to the field of wire diagnostic systems based on the principle of reflectometry. Its subject is a method for detecting soft faults in a cable using a data merging method in order to produce a single diagnostic from the results produced by several mutually independent fault detection methods.

BACKGROUND

Cables are omnipresent in all electrical systems for supplying or transmitting information. These cables are subject to the same constraints as the systems that they link and can be subject to failures. It is therefore necessary to be able to analyze their condition and to provide information on the detection of faults, but also the location and the type thereof, in order to assist in maintenance. The standard reflectometry methods allow this kind of testing.

The reflectometry methods use a principle similar to that of radar: an electrical signal, the probe signal or reference signal, which is more often than not of high frequency or wide band, is injected at one or more points of the cable to be tested. The signal is propagated in the cable or the network and returns a portion of its energy when it encounters an electrical discontinuity. An electrical discontinuity can result, for example, from a connection, from the end of the cable or from a fault, or more generally from a break in the conditions of propagation of the signal in the cable. It results most commonly from a fault which locally modifies the characteristic impedance of the cable by causing a discontinuity in its length related parameters.

The analysis of the signals returned to the injection point make it possible to deduce therefrom information on the presence and the location of these discontinuities, therefore of any faults. An analysis in the time or frequency domain is usually performed. These methods are referred to by the acronyms TDR, from the expression "Time Domain Reflectometry" and FDR, from the expression "Frequency Domain Reflectometry".

The invention falls within the scope of application of the reflectometry methods for wire diagnostics and applies to any type of electrical cable, in particular energy transmission cables or communication cables, in fixed or mobile installations. The cables concerned can be coaxial, two-wire, in parallel lines, in twisted pairs or the like, provided that it is possible to inject therein a reflectometry signal at a point of the cable and measure its reflection at the same point or at another point.

One problem to be resolved for the implementation of a fault detection method based on reflectometry is the limitation, even the cancellation, of false detections, also called "false positives".

One point common to many fault detection methods is the application of a particular post-processing to the measured time-domain reflectogram in order to amplify or isolate the signature of a fault, in particular a soft fault. The search for the signature of the fault in the post-processed reflectogram sometimes leads to the detection of signatures which do not correspond to a fault but to a measurement artefact, to the influence of noise or to other irregularities present in the cable.

One objective of the present invention is to propose a fault detection method that is applicable to soft faults, which generates a reduced rate of false detections compared to the known methods.

The TDR and FDR reflectometry methods, and the methods derived from the latter, such as the MCTDR (Multi-Carrier Time Domain Reflectometry) or OMTDR (Orthogonal Multi-tone Time Domain Reflectometry) methods, have proven their effectiveness in the detection and location of hard faults, that is to say faults which significantly impact the local characteristic impedance of a cable, for example faults associated with damage to the dielectric material of which the cable is composed.

On the contrary, when it comes to detecting and locating the presence of soft faults, that is to say superficial faults, these methods are relatively limited. This difficulty is due to the fact that a soft fault is reflected by a very small variation of characteristic impedance and a reflection coefficient that is also very low. Consequently, a signal that is reflected on such a soft fault will generate a reflection of very low amplitude compared to the amplitude of an identical reflection on a hard fault. The amplitude peak, also called signature, of the soft fault can therefore be buried in the measurement noise or masked by an adjacent hard fault.

A soft fault generally introduces a local modification of the electrical characteristics of a transmission line, for example of a cable. The physical degradation, however superficial, of the line results in particular in a local modification of the characteristic impedance of the cable, which leads to a modification of the reflection coefficient at the point of the fault.

The term soft fault here targets any fault superficially impacting a cable so as to generate a variation of the characteristic impedance locally. In particular, such faults include a grazing or wear of the sheath, of the dielectric but also the start of degradation of the metal conductor, the compression of a cable, rubbing or even corrosion. These degradations can, first of all, seem benign and without notable repercussions for the system. However, if nothing is done, the mechanical or environmental constraints, or even the aging of the cable, will cause a soft fault to evolve into a hard fault, whose consequences, both economical and material, can be considerable. Detecting incipient faults allows for a better management of the maintenance and therefore a reduction of the repair costs.

FIG. 1 represents, in a histogram, an example of average values of the amplitude of the signature of a fault in a reflectogram, as a function of the type of fault. The types of faults are indexed from 1 to 14 and concern:

1: a fault due to the noise of the measurement devices,
2: a fault due to the noise generated by the movement of the cable,
3: a cut in the top of the sheath of the cable of the order of 0.15 mm,
4: a cut in the top of the sheath of the cable of the order of 0.45 mm,
5: a cut in the top of the sheath of the cable of the order of 0.75 mm,
6: a cut in the side of the sheath of the cable of the order of 0.15 mm, 7: a cut in the side of the sheath of the cable of the order of 0.45 mm,
8: a cut in the side of the sheath of the cable of the order of 0.75 mm,
9: a tearing away of the cable insulation,
10: a fault due to humidity,
11: a fault impacting the conductor of the cable,
12: a fault due to humidity on a section of the cable where the insulation has been torn away,
13: an open circuit,
14: a short circuit.

The faults 3 to 11 are considered as soft faults. The list given above in support of FIG. 1 is illustrative and nonlimiting, a soft fault being able to result from other degradations not indicated above. It is understood that the characterization of a soft fault depends on the amplitude of the signal reflected on the impedance discontinuity created by this fault.

Several methods for detecting and/or locating faults, particularly suited to soft faults, are known. The French patent applications filed by the Applicant under the numbers FR1159481, FR1355377, FR1459402, FR1554632, FR1651702 can in particular be cited, as can the methods described in the scientific publications referenced [1] and [2].

One point common to all these methods is that, although they make it possible to improve the detection and the location of soft faults, they all present the drawback of also generating false detections on artefacts of the time-domain reflectogram which do not correspond to faults but to measurement noise or to non-uniformities in the cable. This drawback is due in particular to the fact that these methods generally aim to amplify the signature of a soft fault on a reflectogram but they also lead to the amplification of other non-uniformities. This drawback consequentially results in an ambiguity in the detection and the location of the soft faults.

One objective of the invention is to reduce the false detection rate in comparison to the prior art methods by exploiting the diversity of the existing methods which are mutually independent to apply a data merging method that makes it possible to obtain a unified diagnostic from the results supplied by several independent methods.

SUMMARY OF THE INVENTION

Thus, the subject of the invention is a method for detecting soft faults in a transmission line comprising the following steps:
  acquiring a measurement, called time-domain reflectogram, of a signal characteristic of the reflection of a reference signal previously injected into the line,
  determining the difference between said time-domain reflectogram and a time-domain reflectogram measured previously for the same line or another line of similar characteristics, in order to obtain a corrected time-domain reflectogram,
  applying a plurality of independent transformations to the corrected time-domain reflectogram in order to obtain a plurality of independent transformed reflectograms,
  converting the transformed reflectograms into a plurality of mutually independent probabilities of occurrence of a fault,
  applying a data merging method to the probabilities of occurrence of a fault to deduce therefrom a unified value of the probability of occurrence of a fault.

According to a particular embodiment of the invention, the conversion of each transformed reflectogram into a measurement of the probability of occurrence of a fault comprises the following steps:
  normalizing in amplitude each transformed reflectogram,
  defining a plurality of detection thresholds and, for each normalized reflectogram, constructing a signal representing the percentage of detection thresholds exceeded by each sample,
  temporally discretizing each signal,
  converting each discretized signal into a probability of occurrence of a fault.

According to a particular embodiment of the invention, the normalization in amplitude of each transformed reflectogram is a normalization by the maximum of the absolute value of the samples of the transformed reflectogram.

According to a particular embodiment of the invention, the detection thresholds are defined by choosing an initial threshold so of a value at least greater than an average level of noise and each successive threshold equal to the preceding threshold incremented by a constant pitch.

According to a particular embodiment of the invention, the temporal discretization of each signal comprises:
  the temporal division of the signal into a plurality of time slots and,
  for each time slot, the sum of the numbers of normalized thresholds counted for each sample belonging to said time slot.

According to a particular embodiment of the invention, the conversion of each discretized signal into a probability of occurrence of a fault comprises the application, to each discretized signal, of an affine conversion function.

According to a particular embodiment of the invention, the data merging method applied comprises
  the grouping of the probabilities of occurrence of a fault in pairs,
  a first application of a data merging function to each pair of probabilities,
  an iterative application of the data merging function to the results of the first application until a single unified value of probability of occurrence of a fault is obtained.

According to a variant embodiment, the method according to the invention further comprises a diagnostic step comprising the comparison of the unified value of probability of occurrence of a fault to a detection threshold.

According to a particular embodiment of the invention, the acquisition of a time-domain reflectogram comprises the correlation of the measurement of the signal characteristic of the reflection of a reference signal previously injected into the line and of said reference signal.

Another subject of the invention is a computer program comprising instructions for the execution of the method for detecting soft faults in a cable according to the invention, when the program is run by a processor, and a processor-readable storage medium on which is stored a program comprising instructions for the execution of the method for detecting soft faults in a cable according to the invention, when the program is run by a processor.

BRIEF DESCRIPTION OF THE DRAWINGS

Other features and advantages of the present invention will become more apparent on reading the following description in relation to the attached drawings which represent.

DETAILED DESCRIPTION

Figure 1:
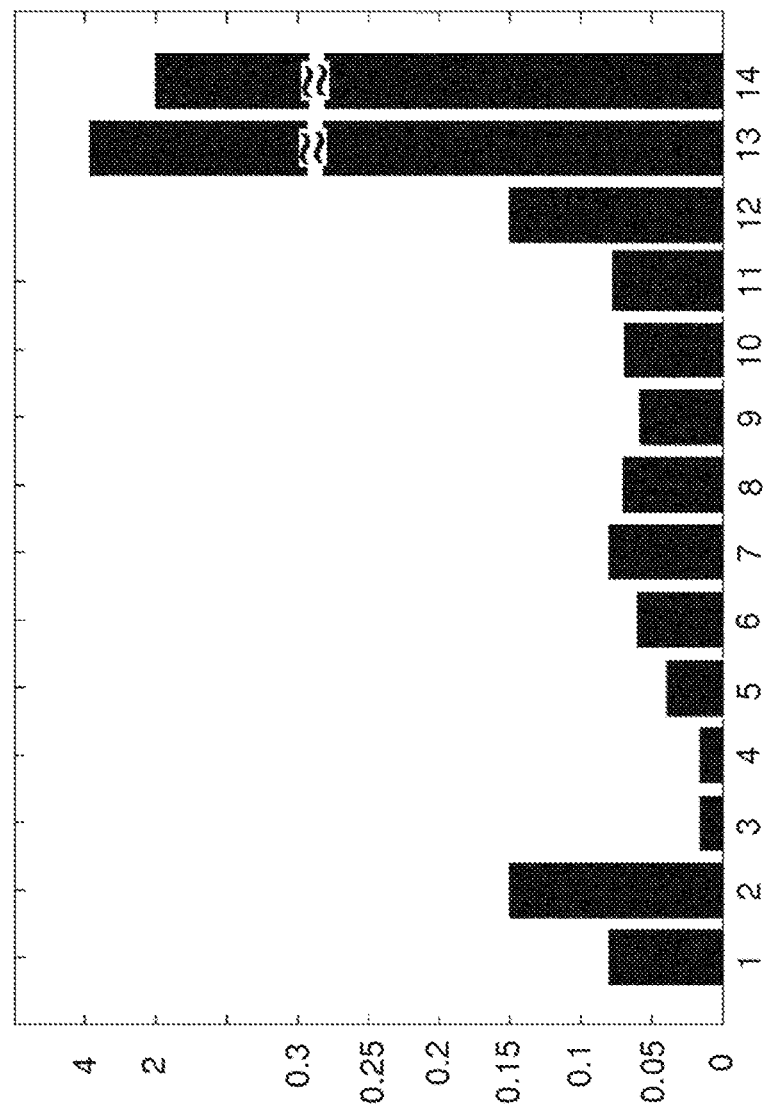
FIG. 1, a histogram illustrating the amplitude of the signature of a fault in a reflectogram, as a function of the type of fault, FIG. 2, a diagram illustrating the known principle of time-domain reflectometry and its application to the detection of a soft fault, FIG. 3, an example of a reflectogram illustrating the appearance of the signature of a soft fault, FIG. 4, a flow diagram detailing the steps of the method according to the invention, FIG. 5, an example of a result of measurement of the probability of appearance of a fault in a cable obtained by the method according to the invention, FIG. 6, an example of a reflectometry system capable of implementing the method according to the invention.
Figure 2:
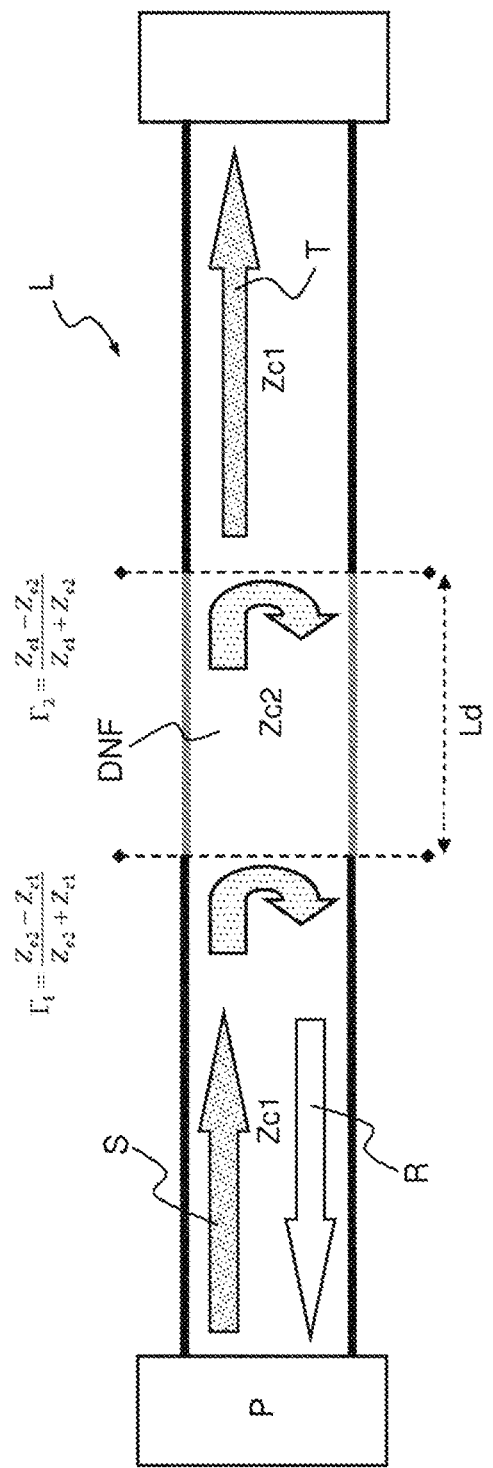

FIG. 2 schematically represents, as a reminder, the principle of operation of a reflectometry diagnostic method applied to a transmission line L exhibiting a soft fault DNF. The example described hereinbelow corresponds to a time-domain reflectometry method.

A reference signal S is injected into the transmission line at a point P. The reflected signal R is measured at the same point P (or at another point of the line). This signal is propagated in the line and encounters, in its propagation, a first impedance discontinuity on the input side of the soft fault DNF. The signal is reflected on this discontinuity with a reflection coefficient $\Gamma_1$. If the characteristic impedance $Z_{c2}$ in the zone of the soft fault DNF is lower than the characteristic impedance $Z_{c1}$ before the appearance of the fault, then the reflection coefficient $\Gamma_1$ is negative and is reflected by a peak of negative amplitude in the reflected signal R. In the reverse case, the reflection coefficient $\Gamma_1$ is positive and is reflected by a peak of positive amplitude in the reflected signal R.

The transmitted part T of the incident signal S continues to be propagated in the line and then encounters a second impedance discontinuity creating a second reflection of the incident signal with a reflection coefficient $\Gamma_2$ of a sign opposite to the first reflection coefficient $\Gamma_1$. If $\Gamma_1<0$ then $\Gamma_2>0$. If $\Gamma_1>0$ then $\Gamma_2<0$.

Figure 3:
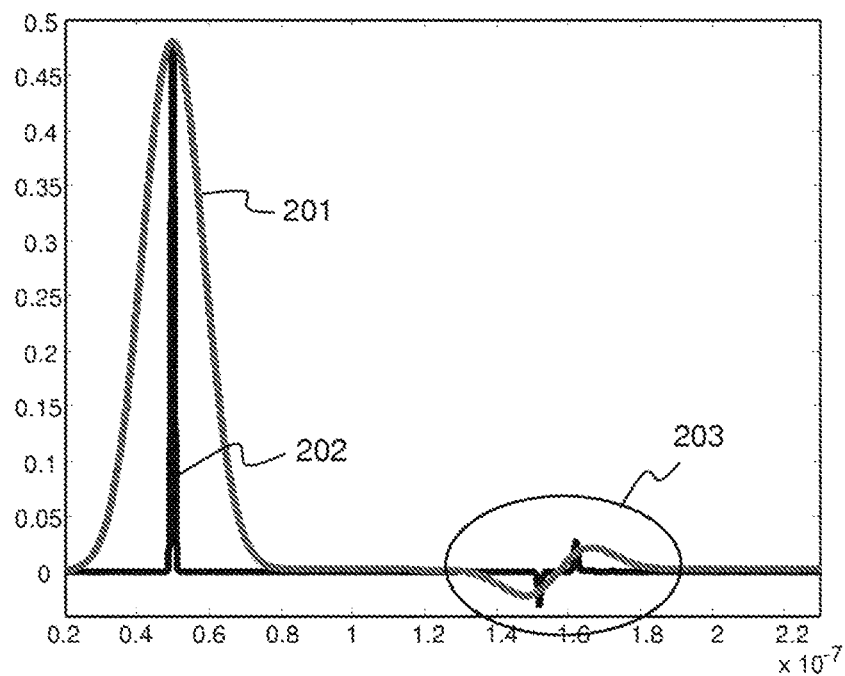

Thus, by observing the reflected signal R, the signature of the soft fault DNF is characterized by two successive peaks of reversed signs as FIG. 3 shows.

FIG. 3 represents a time-domain reflectogram which corresponds either directly to the measurement of the reflected signal R, or to the cross-correlation between the reflected signal R and the signal injected into the cable S.

In the case where the injected reference signal is a temporal pulse, which corresponds to the case of a time-domain reflectometry method, the reflectogram can correspond directly to the measurement of the reflected signal R. In the case where the injected reference signal is a more complex signal, for example for methods of MCTDR or OMTDR type, then the reflectogram is obtained by cross-correlating the reflected signal R and the injected signal S.

FIG. 3 shows two reflectograms 201, 202 corresponding to two different pulse durations for the signal injected into the cable. The curve 201 corresponds to a pulse duration $2.\Delta T$ very much longer than the time of passage, by the signal, through the soft fault DNF. Since the length of the fault is denoted Ld, this duration has the value Ld/V, with V being the speed of propagation of the signal in the cable. The curve 202 corresponds to a pulse duration $2.\Delta T$ very much shorter than the time of passage, by the signal, through the soft fault DNF.

In both cases, the signature 203 of the soft fault, in the reflectogram, is always composed of the succession of a first peak and of a second peak whose signs are reversed.

The distance between the two peaks represents the length of the soft fault and their amplitude represents the severity of the soft fault. Indeed, the greater the variation of the characteristic impedance, the greater the amplitude of the signature of the soft fault also is in the reflectogram.

As is known in the field of reflectometry diagnostic methods, the position $d_{DNF}$ of the soft fault on the cable, in other words its distance to the point P of injection of the signal, can be directly obtained from the measurement, on the time-domain reflectogram of FIG. 3, of the time $t_{DNF}$ between the first amplitude peak recorded on the reflectogram (on the abscissa 0.5 in the example of FIG. 3) and the amplitude peak 203 corresponding to the signature of the soft fault.

Various known methods can be envisaged for determining the position $d_{DNF}$. A first method consists in applying the relationship linking distance and time: $d_{DNF}=V.t_{DNF}$ where V is the speed of propagation of the signal in the cable. Another possible method consists in applying a proportionality relationship of the type $d_{DNF}/t_{DNF}=L/t_0$ where L is the length of the cable and to is the time, measured on the reflectogram, between the amplitude peak corresponding to the impedance discontinuity at the injection point and the amplitude peak corresponding to the reflection of the signal on the end of the cable.

Figure 4:
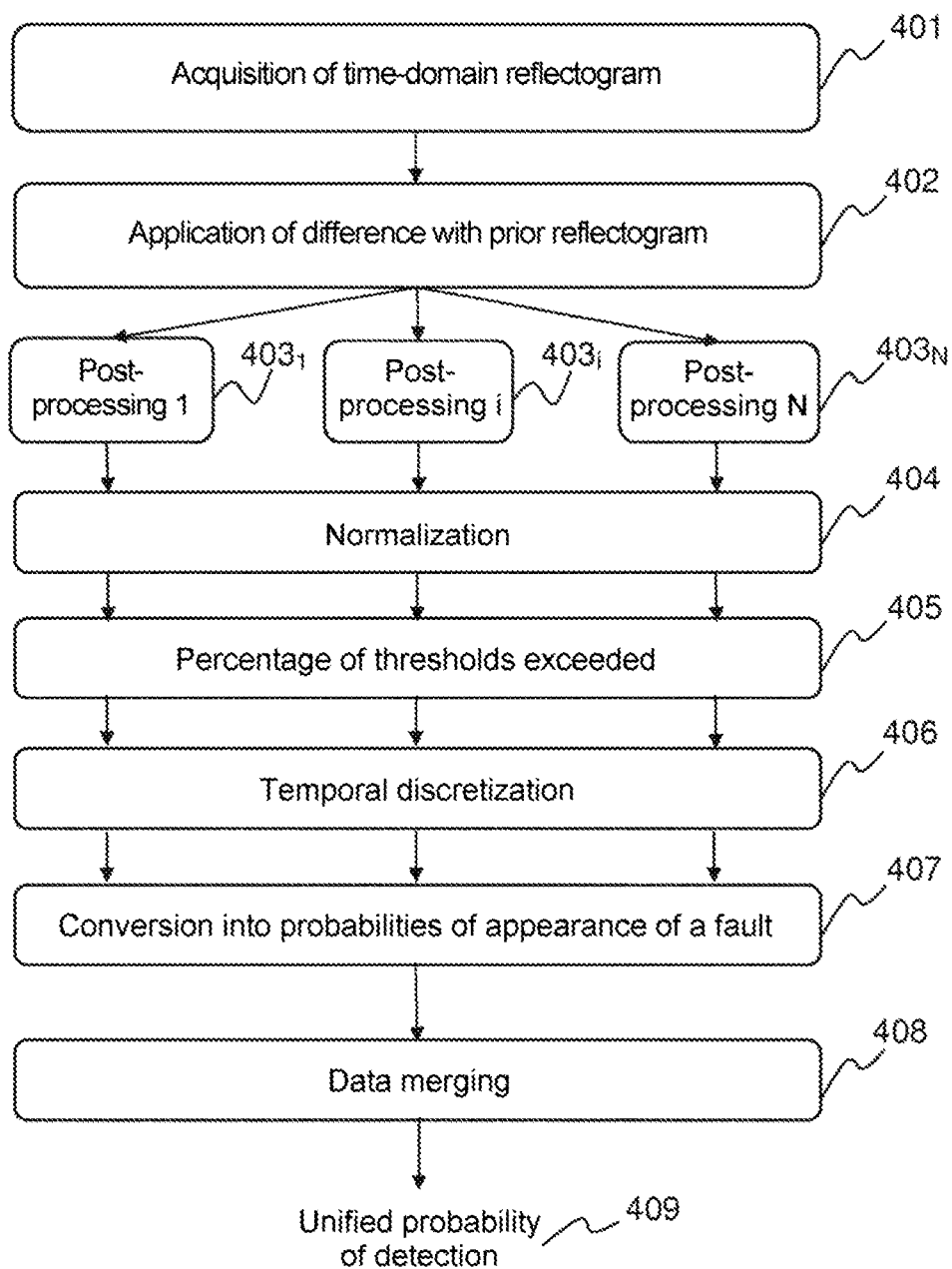

FIG. 4 schematically represents, on a flow diagram, the steps of implementation of the method for detecting soft faults according to the invention.

The method according to the invention is applied to a time-domain reflectogram which reflects the reflections of a reference signal injected into the cable, on the impedance discontinuities that it encounters in its propagation. The nature of the reflectogram depends on the type of reference signal envisaged. Generally, whatever the form of the signal, the reflectogram can be obtained from a measurement of the signal back-propagated in the cable, then a cross-correlation of this measurement with the reference signal which was injected into the cable. In the case where the reference signal used is a temporal pulse, for example a pulse of Gaussian form, the step of cross-correlation of the measurement with the reference signal is not necessary.

Thus, the method begins with the acquisition or the construction 401 of a time-domain reflectogram from at least one measurement of a signal back-propagated in the cable.

In a subsequent step 402, the difference between the time-domain reflectogram obtained in the preceding step 401 and a second time-domain reflectogram obtained previously is determined. The second reflectogram can be obtained from a measurement done at the time of installation of the cable or at any other moment prior to the application of the method according to the invention.

The application of the difference 402 makes it possible to obtain a corrected reflectogram in which the amplitude peaks linked to certain non-uniformities existing inherently in the cable are eliminated from the reflectogram. In other words, the step 402 makes it possible to eliminate the permanent faults of the cable which do not correspond to faults appearing after the installation of the cable and which are due to degradations.

Alternatively, the second reflectogram can also be measured on a distinct cable which has the same physical characteristics (cable type, impedance, length or RLCG parameters) as the cable to be tested, the measurement on this distinct cable being performed at the start of the life of the cable, thus making it possible to guarantee the absence of faults on this cable.

The difference between the current reflectogram and a reflectogram obtained previously also makes it possible to perform a tracking of the evolution of the faults impacting the cable over time.

Several post-processing methods $403_1$, $403_i$, $403_N$ are then applied to the corrected reflectogram obtained after the step 402, the aim of which is to modify the reflectogram in order to amplify or to isolate the signatures of the soft faults. The post-processing methods implemented are mutually independent. In other words, each method applies an algorithmic processing that is different from and uncorrelated with the other processing operations.

A non-exhaustive list of the post-processing methods compatible with the invention is given here, this list being able to be extended to any other method that is alternative to and independent of the methods cited.

The French patent application filed under the number FR1159481 proposes a method which consists in applying to the reflectogram a particular time-frequency transform, based on the Wigner-Ville transform. The application of this transform makes it possible to amplify the signature of the soft faults.

The French patent application filed under the number FR1355377 proposes another method which consists in estimating, in the frequency domain, from the reflectogram, a parameter characteristic of the propagation of a signal being propagated in the cable, including the attenuation $\alpha(f)$, the phase factor $\beta(f)$ or the reflection coefficient $\Gamma_{in}(f)$, then in transposing this estimate into the time domain. This method also makes it possible to amplify the signature of the soft faults.

The French patent application filed under the number FR1459402 proposes another method based on a computation of cross-correlation between the measurement of the reflected signal and the reference signal injected into the cable. The cross-correlation is then normalized by a factor dependent on the energy of the reflected signal, which makes it possible to amplify the signatures correlated with the injection signal with a higher gain for the signatures of low amplitude which are representative of soft faults.

The French patent application filed under the number FR1554632 proposes another method consisting in identifying, in the reflectogram, zero crossings, then in constructing a modified reflectogram in which the amplitude of the signatures of the soft faults is amplified. The modified reflectogram is determined using the relationship $z(t_0+t)=r(t_0+t)-r(t_0-t)$, where $t_0$ is the abscissa of a zero crossing.

The French patent application filed under the number FR1651702 also proposes another method which is based on the integral of the reflectogram.

The publications [1] and [2] propose yet more post-processing methods.

All the methods mentioned above share the common point of implementing a particular transformation of the reflectogram in order to amplify the signatures of the soft faults.

One drawback of these methods is that they can generate false detections because they can also amplify artefacts linked to non-uniformities which are not faults appearing after the installation of the cable.

The steps $403_1$, $403_i$, $403_N$ of the method according to the invention therefore consist in applying to the reflectogram several particular mutually-independent transforms.

The following steps 404 to 407 of the method are executed for each transformed reflectogram obtained by application of the different post-processing methods. All the methods are mutually independent, that is to say that they do not implement transformations that are correlated between them.

A windowing step (not represented in FIG. 4) can be applied to each transformed reflectogram in order to limit the zone of processing of the reflectogram to a zone in which soft faults are likely to appear.

In particular, the application of a windowing step makes it possible to eliminate, in the transformed reflectogram, the amplitude peaks due to the mismatch at the input and at the output of the cable that can lead to an ambiguity in the detection and the location of a soft fault. The mismatch at the input of the cable is due generally to a problem of coupling between the measurement apparatus (network analyzer, arbitrary wave generator and oscilloscope) and the cable under test. For example, performing a measurement on twisted pairs of characteristic impedance equal to 100Ω with a network analyzer of characteristic impedance equal to 50Ω leads to a mismatch at the input of the cable. Artefacts are thus present at the start of the reflectogram creating a blind zone for the detection and the location of the soft fault. The number of samples of the reflectogram to be processed is thus reduced according to the width of the window selected.

Alternatively, the windowing step can be implemented just after the acquisition of the reflectogram 401 or be incorporated in the post-processing steps $403_1$, $403_i$, $403_N$.

The post-processing methods $403_1$, $403_i$, $403_N$ applied are by their nature heterogeneous. One objective of the invention is to adapt the results supplied by these different methods to make them homogeneous in order to apply to them a data merging step 408. In other words, the reflectograms transformed by the application of the post-processing methods $403_1$, $403_i$, $403_N$ are converted into a measurement of the probability of occurrence of a fault, before being merged (step 408) to produce a unified measurement of the probability of occurrence of a fault. The steps 404, 405, 406, 407 describe an exemplary embodiment of this conversion function.

In a step 404, the different transformed reflectograms are unified by applying a normalization step to them.

The normalization is, for example, performed in relation to the maximum value of the absolute values of the samples of a reflectogram as explained by the relationship (1):

$$y_{norm}(i) = \frac{y(i)}{|y|_{max}}, \tag{1}$$

where i is the temporal index of a sample of the reflectogram, y(i) is the amplitude of the sample of index i and $|y|_{max}$ is the maximum amplitude as an absolute value over all of the samples of a reflectogram.

Without departing from the scope of the invention, other normalization functions can be applied, for example a normalization in relation to the average of the absolute values of the samples or any other value derived from the average or from the maximum amplitude as an absolute value.

In a step 405, a dynamic detection threshold s(n) is determined, which can be formulated by the following relationship:

$$s(n)=s_0+n\,p, \forall n \in [0,N] \tag{2}$$

$S_0$ is the initial value of the threshold which is chosen to be greater than the average level of the noise, p is an amplitude pitch between two successive values of the threshold s(n), N is the number of values of the dynamic threshold s(n).

Alternatively, it is possible to set N distinct thresholds having progressive values lying between a minimum threshold $s_0$ and a maximum threshold $s_{max}$.

The increment between two consecutive thresholds can be constant or variable. The values of the thresholds are in particular configured as a function of the a priori knowledge of the average values of the amplitude peaks associated with the signatures of soft faults that the user wants to detect.

The step 405 then consists in converting each normalized reflectogram obtained at the end of the step 404 into a signal representing, for each sample, the percentage of thresholds exceeded by this sample.

In a step 406, a temporal discretization is then applied to each signal obtained in the step 405. In other words, a signal obtained in the step 405 is discretized by grouping the samples of the signal by time slots. This step is necessary in order to homogenize the results deriving from the application of different post-processing methods. Indeed, depending on the transformation applied to the reflectogram, the amplitude peak corresponding to a soft fault may undergo a slight time shift. In order ultimately to proceed with a merging of the data obtained from the different methods, the step 406 makes it possible to unify the results by reasoning by time slots in order to absorb the slight time shifts that may exist between the results deriving from different post-processing methods.

The widths of the slots can be identical to one another or not. Each time slot corresponds, in the space domain, to a section of the cable analyzed.

The constraints to be observed for the discretization of a signal are two-fold. The discretization must correspond to a complete partition, that is to say that two distinct time slots must not overlap. In addition, all the samples of the signal must belong to a time slot. The number of slots must be finite.

The widths of the slots can be variable to allow a resolution of the representation suited to the conducting of a wire diagnostic by increasing the number of time slots in the time zones corresponding to sections of the cable which are likely to constitute zones exhibiting soft faults.

The minimum size of each time slot depends directly on the sensitivity of the analysis methods, and in particular on the wavelength of the signal used for the construction of the reflectograms.

Once the time slots are defined, a discretized signal is obtained by summing the values of the samples of the non-discretized signal which belong to the same slot.

In a step 407, the different discretized signals are then each converted into a measurement of the probability of occurrence of a fault at a position of the cable corresponding to a temporal index of the reflectogram.

The objective of this step 407 is to produce a unifying representation of the different results obtained in the step 406 in order to allow the subsequent aggregation thereof in the step 408 to perform a merging of the various pieces of information.

More specifically, the step 407 consists in converting the discretized signals from the step 406 into probability of appearance of a fault per section of cable, a section corresponding to a time slot on the abscissa of the discretized signals. This probability is hereinafter denoted $P(D_i/m)$ with m an index making it possible to identify the post-processing method used out of the methods applied in the steps 403$_1$, 403$_i$, 403$_N$.

For that, the following definitions and hypotheses are introduced. Each section $t_i$ of the cable to be analyzed is subjected to a random binary test $E(t_i)$: "State of the section of cable $t_i$". The possible outcomes of this random test are:

$D_i$: the section $t_i$ includes a soft fault $S_i = \overline{D_i}$: the section $t_i$ is healthy (it does not include any faults)

A measurement of probability $P(D_i/m)$ of the event $D_i$ is then determined, such that probabilities close to 1 will almost certainly indicate the presence of a soft fault, whereas probabilities close to 0 will indicate the almost certain absence of a fault. The probability values can evolve continuously within the range [0,1] thus making it possible to represent the presence of a soft fault with an accurate and progressive level of confidence.

A notable value of the probability is the value $P(D_i/m) = 0.5$. This value encodes the information whereby the two states of the section (defective and healthy) are equally probable. In other words, if a section $t_i$ exhibits this probability value, it is not possible to form an opinion leaning in one direction or in the other. This probability thus encodes the lack of reliable information on the section $t_i$.

It is assumed that the random test for each section is independent of those of the other sections.

It is then proposed to construct the probability $P(D_i/m)$ of the event $D_i$ from the signals discretized in the step 406 as follows.

The values of the samples of the discretized signals obtained on completion of the step 406 lie between two real positive values 0 and SMAX, SMAX varying according to the post-processing methods.

To convert a discretized signal S into probability of appearance of a fault on the section $t_i$, a mapping function $f_m$ is used that is defined as follows:

$$f_m: [0; SMAX] \rightarrow [0;1]$$

$$S(t_i) \rightarrow P(D_i|m)$$

The mapping function $f_m$ must be strictly increasing. The choice of the function can be adapted to each post-processing method in order to allow the most relevant probabilistic interpretation possible.

An example of possible function is given by the relationship (3).

$$P(D_i | m) = f_m(S(t_i)) = P_{min} + \frac{P_{max} - P_{min}}{S_{max}} \cdot S(t_i) \tag{3}$$

This is an affine function transforming the interval [0; Smax] into the interval [Pmin, Pmax] with Pmin and Pmax parameters satisfying 0<Pmin<Pmax<1.

Pmin is the minimum value of the probability of appearance of a fault thus constructed. Pmax is its maximum value. The values of these two parameters are in particular determined in relation to the relative confidence that is desired to be associated with the results of each post-processing method. A value close to 0 chosen for Pmin indicates a very high confidence that a peak of very low amplitude does not correspond to a fault. A value close to 1 chosen for Pmax indicates a very high confidence that a peak of very high amplitude corresponds to a fault.

Thus, the parameters Pmin and Pmax can be different for each post-processing method and therefore for each discretized signal at the input of the step 407.

The choice of the parameters Pmin and Pmax can also be the subject of a preliminary calibration phase. The choice of Pmin can in particular be guided by the initial step of taking a measurement on a healthy cable at the time of its installation. Based on the quality of the reference measurement (background noise, non-uniformity detected in the cable), a more or less high value of Pmin will be able to be chosen. In particular for cables where the background noise is very high, it will be possible to bring Pmin close to the value 0.5.

The value of Pmax can be adjusted according to the capacity of the post-processing method not to generate false positives. The more likely the method is to produce a false positive, the less high should be the value of Pmax.

In a final step 408, a merging of the probabilities of appearance of faults produced by the step 407 is applied. For that, a data merging or information merging function is applied.

The interpretation of the results of the post-processing methods in the form of probabilities of appearance of fault per section as supplied by the step 407 makes it possible to benefit from all the theoretical works carried out in the field of the probabilistic merging of information. These works are in particular described in the references [3] and [4].

One hypothesis of the method according to the invention is that the different post-processing methods $403_1$, $403_i$, $403_N$ are executed sequentially on the cable, and that the effect of one measurement does not impact a subsequent measurement. By taking $P_x=P(D|m_x)$, where D is the "appearance of a fault on a section" event and $m_x$ identifies a post-processing method, that means formally that the probabilities Px and Py are independent as soon as x≠y. Moreover, if there is no a priori knowledge concerning the cable, nor any measurement, it is assumed that $P(D_i)=P(\overline{D_i})=0.5$.

In these conditions, it can be shown that the result of the merging of the information deriving from two post-processing methods $m_1$ and $m_2$ can be computed using the following formula:

$$P(D|m_1, m_2) = \frac{P_1 P_2}{P_1 P_2 + (1 - P_1)(1 - P_2)} \quad (4)$$

This merging function can then be called iteratively to merge the results of any number of independent methods.

In other words, if N post-processing methods are called in the steps $403_1$, $403_i$, $403_N$, then the function (4) is applied to the results of the step 407 taken in pairs. Then, the method is iterated by once again applying the function (4) to the results of the preceding iteration taken in pairs and so on until a single probability of appearance of a fault is obtained 409.

The merging function given by the relationship (4) has a number of interesting properties. Firstly, the merging of P with 0.5 gives P: the absence of information does not modify the current estimation of the presence of a fault. Secondly, it makes it possible to reinforce convergent appraisals. Thus, if P1 and P2 are both greater than 0.5, the result of the merging will also be greater than 0.5 and even greater than P1 and P2.

Any other function of merging of information deriving from the works of the probabilistic merging of information can be used instead of the function (4). In particular, it is also possible to use a function whose number of operands is greater than two, and even, to use a single function to merge the N results without necessitating the performance of an iterative process.

Figure 5:
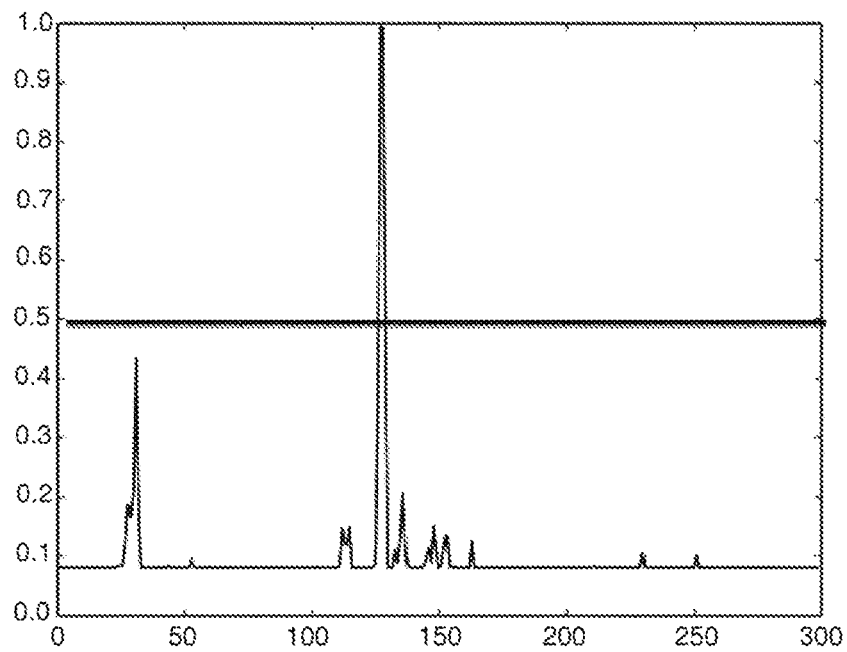

FIG. 5 presents an example of a result obtained on completion of the step 408. The probability curve represented in FIG. 5 can be used as such to identify the presence of a fault by observing the probability peaks on the curve. It can also be associated with an automated diagnostic step which consists in comparing the values of the probability curve to a detection threshold, for example set to the value 0.5. The probability values greater than 0.5 reflect a greater likelihood of the existence of a fault.

One important advantage of the method according to the invention compared to the methods of the prior art is that it makes it possible to reduce the false detection rate through the application of a data merging applied to results deriving from different independent processing operations applied to one and the same reflectogram.

The method according to the invention can be implemented as a computer program, the method being applied to a reflectometry measurement r previously acquired using a standard reflectometry device. The invention can be implemented as a computer program comprising instructions for its execution. The computer program can be stored on a processor-readable storage medium.

The reference to a computer program which, when it is run, performs any of the functions described previously, is not limited to an application program running on a single host computer. On the contrary, the terms computer program and software are used here in a general sense to refer to any type of computer code (for example, application software, firmware, microcode, or any other form of computer instruction) which can be used to program one or more processors to implement aspects of the techniques described here. The computing means or resources can in particular be distributed ("Cloud computing"), possibly according to peer-to-peer technologies. The software code can be executed on any appropriate processor (for example a microprocessor) or processor core or a set of processors, whether provided in a single computation device or distributed between several computation devices (for example such as possibly accessible in the environment of the device). The executable code of each program allowing the programmable device to implement the processes according to the invention can be stored, for example, in a hard disk or in a read-only memory. Generally, the program or programs will be able to be loaded into one of the storage means of the device before being executed. The central unit can control and direct the execution of the instructions or software code portions of the program or programs according to the invention, instructions which are stored in the hard disk or in the read-only memory or even in other abovementioned storage elements.

Alternatively, the invention can also be implemented by means of a processor embedded in a specific test device. The processor can be a generic processor, a specific processor, an application-specific integrated circuit (known also by the acronym ASIC) or a field-programmable gate array (known also by the acronym FPGA). The device according to the invention can use one or more dedicated electronic circuits or a general-purpose circuit. The technique of the invention can be implemented on a reprogrammable computation machine (a processor or a microcontroller for example) running a program comprising a sequence of instructions, or on a dedicated computation machine (for example a set of logic gates such as an FPGA or an ASIC, or any other hardware module).

Figure 6:
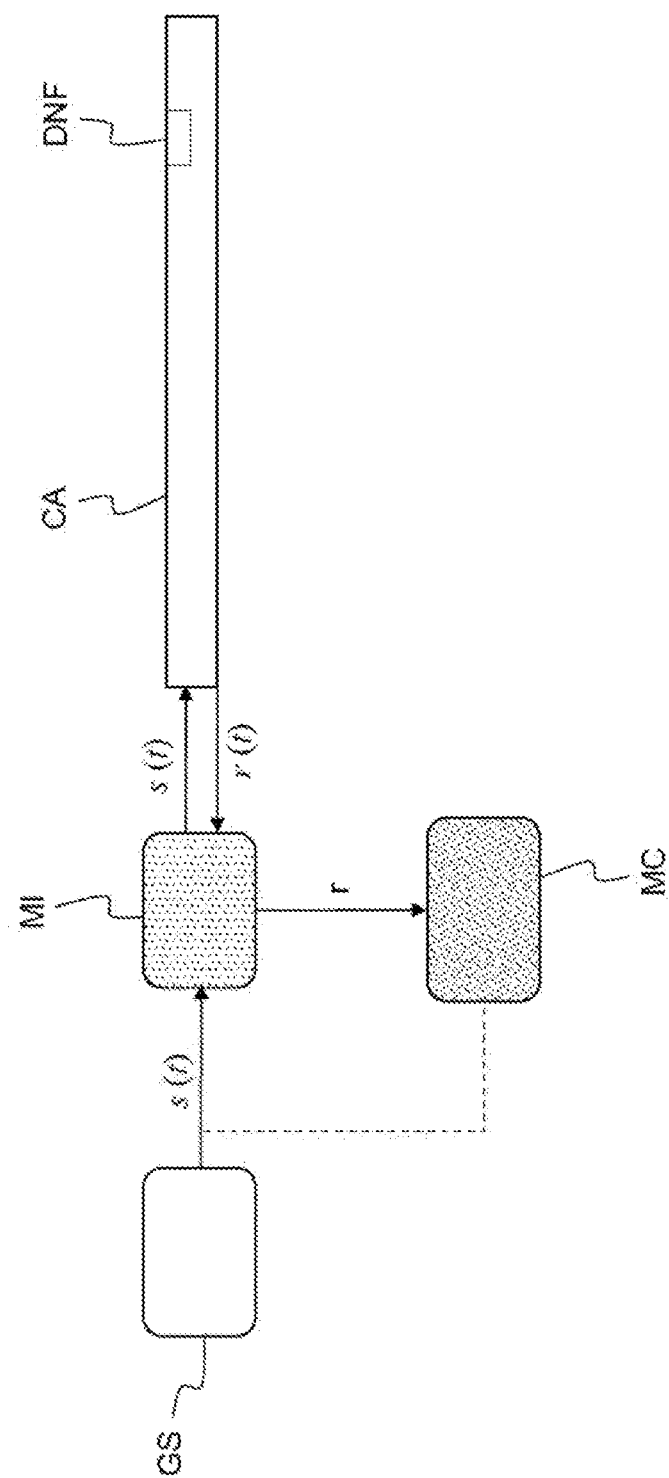

FIG. 6 schematically represents, on a block diagram, an example of a reflectometry system capable of implementing the method according to the invention.

A reflectometry system, or reflectometer, comprises at least one signal generator GS, for generating a test signal s and injecting it into the cable to be analyzed CA which includes a soft fault DNF, a measurement device MI for measuring the reflected signal r in the cable CA and an electronic component MC of integrated circuit type, such as a programmable logic circuit, for example of FPGA type, or a microcontroller, for example a digital signal processor, which receives the measurement of the reflected signal r(t) and is configured to execute the method according to the invention in order to detect and locate one or more soft faults. The electronic component MC can also comprise both an integrated circuit, for example to perform the acquisition of the reflected signal, and a microcontroller for executing the processing steps required by the invention.

The injection of the test signals into the cable can be performed by a coupling device (not represented in FIG. 6) which can be a capacitive or inductive effect coupler or even using an ohmic connection. The coupling device can be produced by physical connectors which link the signal generator to the cable or by contactless means, for example by using a metal cylinder whose inner diameter is substantially equal to the outer diameter of the cable and which produces an effect of capacitive coupling with the cable.

The acquisition of the signal reflected in the cable can also be performed by means of a coupling device of the type described previously.

The reflectometry system can also comprise a digital-analog converter arranged between the test signal generator, in the case where it is a digital signal, and the injection coupler.

The reflectometry system can also comprise an analog-digital converter arranged between the reflected signal measurement coupler and the measurement device MI or the electronic component MC for the purposes of digitizing the measured analog signal.

Furthermore, a processing unit (not represented in FIG. 6), of computer type, personal digital assistant type or the like is used to drive the reflectometry system according to the invention and display the results of the measurements on a human-machine interface.

The results displayed can comprise one or more reflectograms computed using the method according to the invention and/or information concerning the existence and the location of a fault on the cable also produced by the method according to the invention.

According to a particular embodiment, the test signal s injected can also be supplied to the component MC when the processing operations performed require the knowledge of the injected signal, in particular when the latter includes a step of cross-correlation between the test signal s and the reflected signal r.

The injection of the signal into the cable and the measurement of the reflected signal can be performed by one and the same component but also by two distinct components, in particular when the injection point and the measurement point are dissociated.

The system described in FIG. 6 can be implemented by an electronic circuit board on which the various components are arranged. The board can be connected to the cable by a coupler.

Furthermore, a processing unit, of computer type, personal digital assistant type or other equivalent electronic or computer device can be used to drive the reflectometry device and display the results of the computations performed by the component MC on a human-machine interface, in particular the information on detection and location of faults on the cable.

REFERENCES

[1] Y. J. Shin et al. "Joint Time-Frequency Domain Reflectometry for Diagnostics of Coaxial Cables". In 8th Joint NASA/FAA/DoD Conference on Aging Aircraft. 2005.

[2] Lola El Sahmarany. "Méthodes d'amélioration pour le diagnostic de câble par réflectométrie" [Enhancement methods for reflectometry-based cable diagnostics]. Université Blaise Pascal—Clermont-Ferrand II, 2013.

[3] H. Moravec, "Sensor fusion in certainty grids for mobile robots" in AI Mag. Vol. 9, July 1988

[4] J. Berger, "Statistical decision theory and Bayesian analysis" 2nd edition, Springer, 1985

The invention claimed is:

1. A computer-implemented method for detecting soft faults in a transmission line comprising the steps of:
   acquiring a measurement, called time-domain reflectogram, of a signal characteristic of the reflection of a reference signal previously injected into the line,
   determining a difference between said time-domain reflectogram and a time-domain reflectogram measured previously for the same line or another line of similar characteristics, in order to obtain a corrected time-domain reflectogram,
   applying a plurality of independent transformations to the corrected time-domain reflectogram in order to obtain a plurality of independent transformed reflectograms,
   converting the transformed reflectograms into a plurality of mutually independent probabilities of occurrence of a fault,
   applying a data merging method to the probabilities of occurrence of a fault to deduce therefrom a unified value of the probability of occurrence of a fault.

2. The method for detecting soft faults in a transmission line of claim 1, in which the step of converting the transformed reflectograms into a plurality of mutually independent probabilities of occurrence of a fault, comprises the sub-steps of:
   normalizing in amplitude each transformed reflectogram,
   defining a plurality of detection thresholds and, for each normalized reflectogram, generating a signal representing a percentage of detection thresholds exceeded by each sample,
   temporally discretizing each signal, converting each discretized signal into a probability of occurrence of a fault.

3. The method for detecting soft faults of claim 2, in which the normalization in amplitude of each transformed reflectogram is a normalization by the maximum of the absolute value of the samples of the transformed reflectogram.

4. The method for detecting soft faults of claim 2, in which the detection thresholds are defined by choosing an initial threshold $s_0$ of a value at least greater than an average level of noise and by choosing each successive threshold equal to the proceeding threshold incremented by a constant pitch.

5. The method for detecting soft faults of claim 2, in which the sub-step of temporally discretizing each signal comprises: a temporal division of the signal into a plurality of time slots and, for each time slot, a sum of the numbers of normalized thresholds counted for each sample belonging to said time slot.

6. The method for detecting soft faults of claim 2, in which the sub-step of converting each discretized signal into a probability of occurrence of a fault comprises the application, to each discretized signal, of an affine conversion function.

7. The method for detecting soft faults of claim 1, in which the step of applying a data merging method comprises:
   the grouping of the probabilities of occurrence of a fault in pairs,
   a first application of a data merging function to each pair of probabilities,
   an iterative application of the data merging function to the results of the first application until a single unified value of probability of occurrence of a fault is obtained.

8. The method for detecting soft faults of claim 1, further comprising a diagnostic step of comparing the unified value of probability of occurrence of a fault to a detection threshold.

9. The method for detecting soft faults of claim 1, in which the acquisition of a time-domain reflectogram comprises the correlation of the measurement of the signal characteristic of the reflection of a reference signal previously injected into the line and of said reference signal.

10. A computer program comprising instructions stored on a tangible non-transitory storage medium for executing on a processor a method for detecting soft faults in a transmission line comprising the steps of:
   acquiring a measurement, called time-domain reflectogram, of a signal characteristic of the reflection of a reference signal previously injected into the line,
   determining a difference between said time-domain reflectogram and a time-domain reflectogram measured previously for the same line or another line of similar characteristics, in order to obtain a corrected time-domain reflectogram,
   applying a plurality of independent transformations to the corrected time-domain reflectogram in order to obtain a plurality of independent transformed reflectograms,
   converting the transformed reflectograms into a plurality of mutually independent probabilities of occurrence of a fault,
   applying a data merging method to the probabilities of occurrence of a fault to deduce therefrom a unified value of the probability of occurrence of a fault.

11. A tangible non-transitory processor-readable recording medium on which is stored a program comprising instructions for executing on a processor a method for detecting soft faults in a transmission line comprising the steps of:
   acquiring a measurement, called time-domain reflectogram, of a signal characteristic of the reflection of a reference signal previously injected into the line,
   determining a difference between said time-domain reflectogram and a time-domain reflectogram measured previously for the same line or another line of similar characteristics, in order to obtain a corrected time-domain reflectogram,
   applying a plurality of independent transformations to the corrected time-domain reflectogram in order to obtain a plurality of independent transformed reflectograms,
   converting the transformed reflectograms into a plurality of mutually independent probabilities of occurrence of a fault,
   applying a data merging method to the probabilities of occurrence of a fault to deduce therefrom a unified value of the probability of occurrence of a fault.

* * * * *